United States Patent [19]

Muka et al.

[11] Patent Number: 5,588,789

[45] Date of Patent: Dec. 31, 1996

[54] LOAD ARM FOR LOAD LOCK

[75] Inventors: Richard S. Muka, Topsfield, Mass.; Christopher A. Hofmeister, Hampstead, N.H.

[73] Assignee: Brooks Automation, Chelmsford, Mass.

[21] Appl. No.: 498,835

[22] Filed: Jul. 6, 1995

[51] Int. Cl.⁶ .................................... B25J 11/00
[52] U.S. Cl. ................ 414/217; 414/744.2; 414/935; 414/939; 414/940; 414/917
[58] Field of Search ................ 414/217, 935, 414/939, 940, 917, 744.1, 744.2; 901/11, 13

[56] References Cited

U.S. PATENT DOCUMENTS

| | | | |
|---|---|---|---|
| 2,500,815 | 3/1950 | Gerli et al. | 414/917 X |
| 4,381,965 | 5/1983 | Maher, Jr. et al. | 156/345 |
| 4,411,586 | 10/1983 | Zitser et al. | 414/917 X |
| 4,674,936 | 6/1987 | Bonora | 414/217 |
| 4,674,939 | 6/1987 | Maney et al. | 414/292 |
| 4,676,709 | 6/1987 | Bonora et al. | 414/217 |
| 4,687,542 | 8/1987 | Davis et al. | 414/217 X |
| 4,715,921 | 12/1987 | Maher et al. | 156/345 |
| 4,724,874 | 2/1988 | Parikh et al. | 141/98 |
| 4,730,976 | 3/1988 | Davis et al. | 414/749 |
| 4,739,882 | 4/1988 | Parikh et al. | 206/454 |
| 4,749,330 | 6/1988 | Hine | 414/935 X |
| 4,802,809 | 2/1989 | Bonora et al. | 414/217 |
| 4,815,912 | 3/1989 | Maney et al. | 414/217 |
| 4,951,601 | 8/1990 | Maydan et al. | 118/719 |
| 4,995,430 | 2/1991 | Bonora et al. | 141/98 |
| 5,049,029 | 9/1991 | Mitsui et al. | 414/939 X |
| 5,133,284 | 7/1992 | Thomas et al. | 118/719 |
| 5,166,884 | 11/1992 | Maney et al. | 364/468 |
| 5,169,272 | 12/1992 | Bonora et al. | 414/217 |
| 5,180,276 | 1/1993 | Hendrickson | 414/752 |
| 5,193,658 | 3/1993 | Telldén | 901/11 X |
| 5,306,380 | 4/1994 | Hiroki | 414/935 X |
| 5,333,986 | 8/1994 | Mizukami et al. | 414/935 X |
| 5,474,410 | 12/1995 | Ozawa et al. | 414/744.2 X |

FOREIGN PATENT DOCUMENTS

| | | | |
|---|---|---|---|
| 300006 | 12/1988 | Japan | 414/939 |
| 64232 | 3/1989 | Japan | 414/939 |
| 157547 | 6/1989 | Japan | 414/939 |
| WO87/07309 | 12/1987 | WIPO . | |

*Primary Examiner*—David A. Bucci
*Attorney, Agent, or Firm*—Perman & Green

[57] ABSTRACT

Load transferring apparatus comprises a base member, a planar platform for supporting a load and a drive arm pivotally mounted on the base member for moving the platform in plane between a retracted position at which the platform assumes a first orientation and an extended position at which the platform assumes a second angularly transposed orientation while remaining substantially in the plane occupied when in the retracted position. The drive arm is fixed to a drive arm shaft which, in turn, is rotatably mounted on the base member. A constraining link extends between the base member and the platform and is generally parallel to the drive arm. An elevator drive is operable for moving the base member raised and lowered positions and a coupling drivingly connects the drive arm shaft to the drive shaft throughout a range of positions between the raised position and the lowered position. The base plate includes an upstanding stop plate. A tension spring extends between the platform and the drive arm to bias the drive arm into a proximate relationship with the stop plate and to bias the platform to the retracted position. A pair of juxtaposed magnets of opposite polarity are respectively mounted on the drive arm and on the stop plate to thereby draw the drive arm toward the stop plate. The apparatus of the invention may be used in combination with a load lock defining a chamber having a substantially particle free environment.

21 Claims, 7 Drawing Sheets

LOAD ARM FOR LOAD LOCK

BACKGROUND OF THE INVENTION

1. Field of the Invention

The apparatus of the present invention relates generally to material transfer devices. The material transferred might include, but not be limited to, semiconductor wafers, such as silicon and gallium arsenide, semiconductor packaging substrates, such as high density interconnects, semiconductor manufacturing process imaging plates, such as masks or reticles, and large area display panels, such as active matrix LCD substrates.

2. Description of the Prior Art

Throughout this disclosure, the term "wafer" will be used for purposes of consistency to refer to such substrates as just mentioned, but it will be understood that the term is intended to be used in the broad context so as to be applicable to all substrates. Typically, such substrates are circular and have a diameter of 200 mm and thickness of approximately 0.760 mm although, more recently, the diameter of choice has evolved to 300 mm with the same thickness. The invention is especially beneficial for operating on the newer size of substrates.

The transfer of delicate silicon wafers of the like between a plurality of work stations or locations in the manufacture of semiconductor devices presents unique handling problems. The silicon wafers are very delicate and have highly polished surfaces, yet for maximum throughput must be handled rapidly and with accuracy. Previously, it was customary to place cassettes, that is, portable carriers generally employed for supporting and transporting a plurality of wafers in spaced stacked relationship manually into a load lock or other intermediate holding station. Such a holding station is proximate to a further transfer station from which wafers are typically transported to and from a plurality of processing stations. In known constructions, load locks require a human or robot loader to place wafers or cassettes holding multiple wafers into the load lock. This procedure is often difficult because of customarily small clearances between the chamber walls and the wafers.

Various constructions are known for transferring wafers from one location to another. Typical of such apparatus are the disclosures in U.S. Pat. No. 4,674,936 to Bonora, U.S. Pat. No. 4,802,809 to Bonora, and U.S. Pat. No. 5,169,272 to Bonora et al., each of which disclose apparatus for transferring a cassette supporting multiple wafers from a SMIF (standard mechanical interface) system container.

In U.S. Pat. No. 4,730,976 to Davis et al., an articulated arm assembly extends and retracts in a "froglike" motion to transfer a wafer between a plurality of locations. The articulated arm assembly is rotatable about a pivot point in a radial plane and can be raised and lowered in an axial direction.

An improvement on Davis et al. is provided in commonly assigned U.S. Pat. No. 5,180,276 to Hendrickson which again utilizes a "froglike" or "frogkick" type of motion. Another construction of wafer transport apparatus is disclosed in International Application No. PCT/US87/01176 to Westrake which discloses a mechanism for retrieving a wafer from a cassette in a load lock and advancing it into a reactive chamber for processing.

It was in light of the foregoing state of the art that the present invention has been conceived and is now reduced to practice. Specifically, the invention results from efforts to increase throughput of existing wafer handling systems in a manner compatible with existing systems while assuring protection for the wafers.

SUMMARY OF THE INVENTION

According to the invention, load transferring apparatus comprises a base plate, a planar platform for supporting a load and a drive arm pivotally mounted on the base plate for moving the platform in plane between a retracted position at which the platform assumes a first orientation and an extended position at which the platform assumes a second angularly transposed orientation while remaining substantially in the plane occupied when in the retracted position. The drive arm is fixed to a drive arm shaft which, in turn, is rotatably mounted on the base plate. A constraining link extends between the base plate and the platform and is generally parallel to the drive arm. An elevator drive is operable for moving the base plate raised and lowered positions and a coupling drivingly connects the drive arm shaft to the drive shaft throughout a range of positions between the raised position and the lowered position. The base plate includes an upstanding stop plate. A tension spring extends between the platform and the drive arm to bias the drive arm into a proximate relationship with the stop plate and to bias the platform to the retracted position. A pair of juxtaposed magnets of opposite polarity are respectively mounted on the drive arm and on the stop plate to thereby draw the drive arm toward the stop plate. The apparatus of the invention may be used in combination with a load lock defining a chamber having a substantially particle free environment.

A primary object of the invention is to increase productivity of wafer processing systems.

Another object of the invention is to transfer a cassette containing a plurality of wafers in spaced stacked relationship from a support shelf adjacent a wafer processing system into a load lock properly positioned for further movement within the system.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

DETAILED DESCRIPTION OF THE PREFERRED EMBODIMENTS

Figure 1:
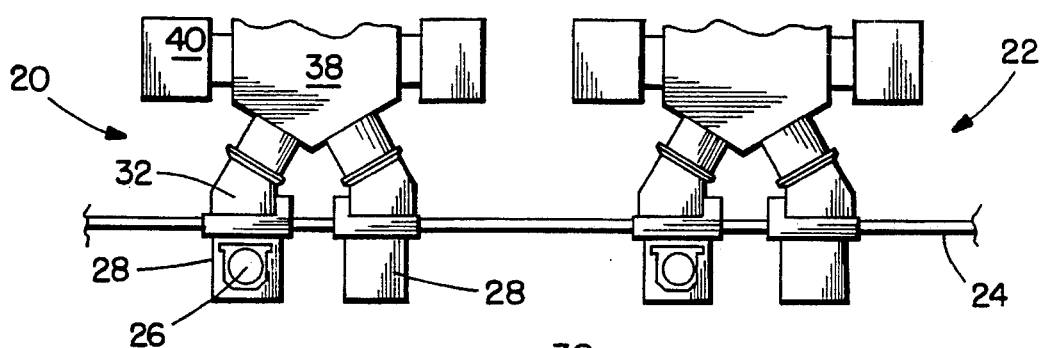
FIG. 1 is a top plan diagrammatic view of a pair of side by side processing systems of the type capable of utilizing the wafer transfer apparatus of the invention.

Turn now to the drawings and, initially, to FIG. 1 which illustrates a series of processing systems 20 for operating on silicon planar substrates such as wafers and flat panels. As noted earlier, the term "wafer" will be used for purposes of consistency to refer to such substrates, but it will be understood that it is intended to be used in the broad context so as to be applicable to all substrates. The processing systems 20 may be arranged, for example, in side-by-side fashion within a "clean room" 22 separated from the outside environment by a wall 24. More recently, it has become customary to eliminate the clean room and, instead, maintain a desired clean environment within the system 20 and within each instrumentality which interfaces with the system.

Figure 3:
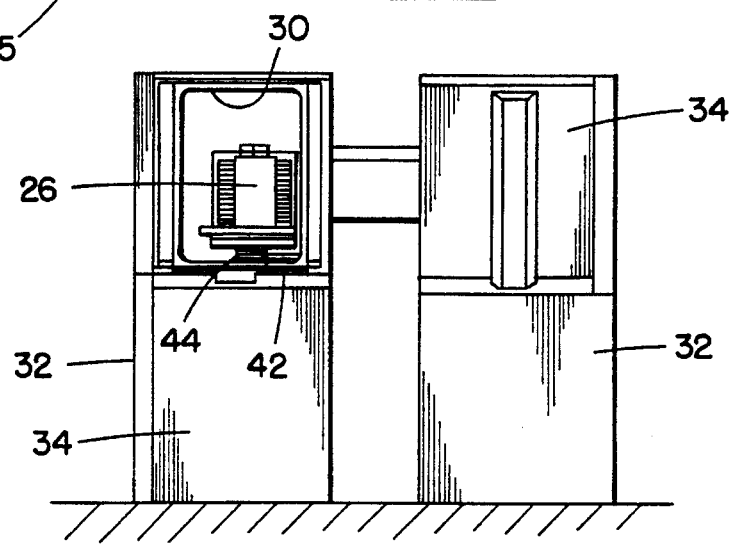
FIG. 3 is a front elevation view of the processing system illustrated in FIG. 2.
Figure 4:
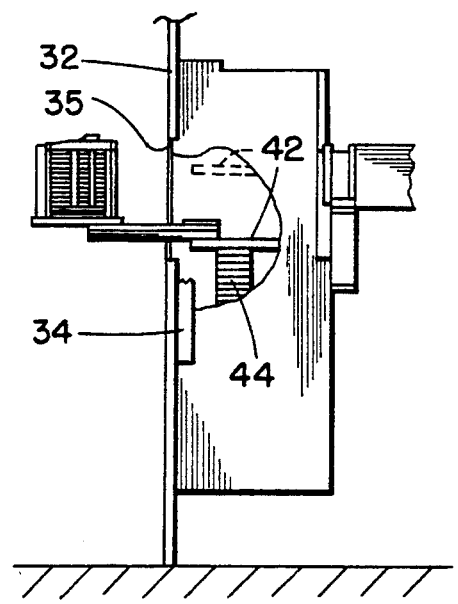
FIG. 4 is a side elevation view, certain parts being cut away for clarity, of the processing system illustrated in FIG. 3.
Figure 5:
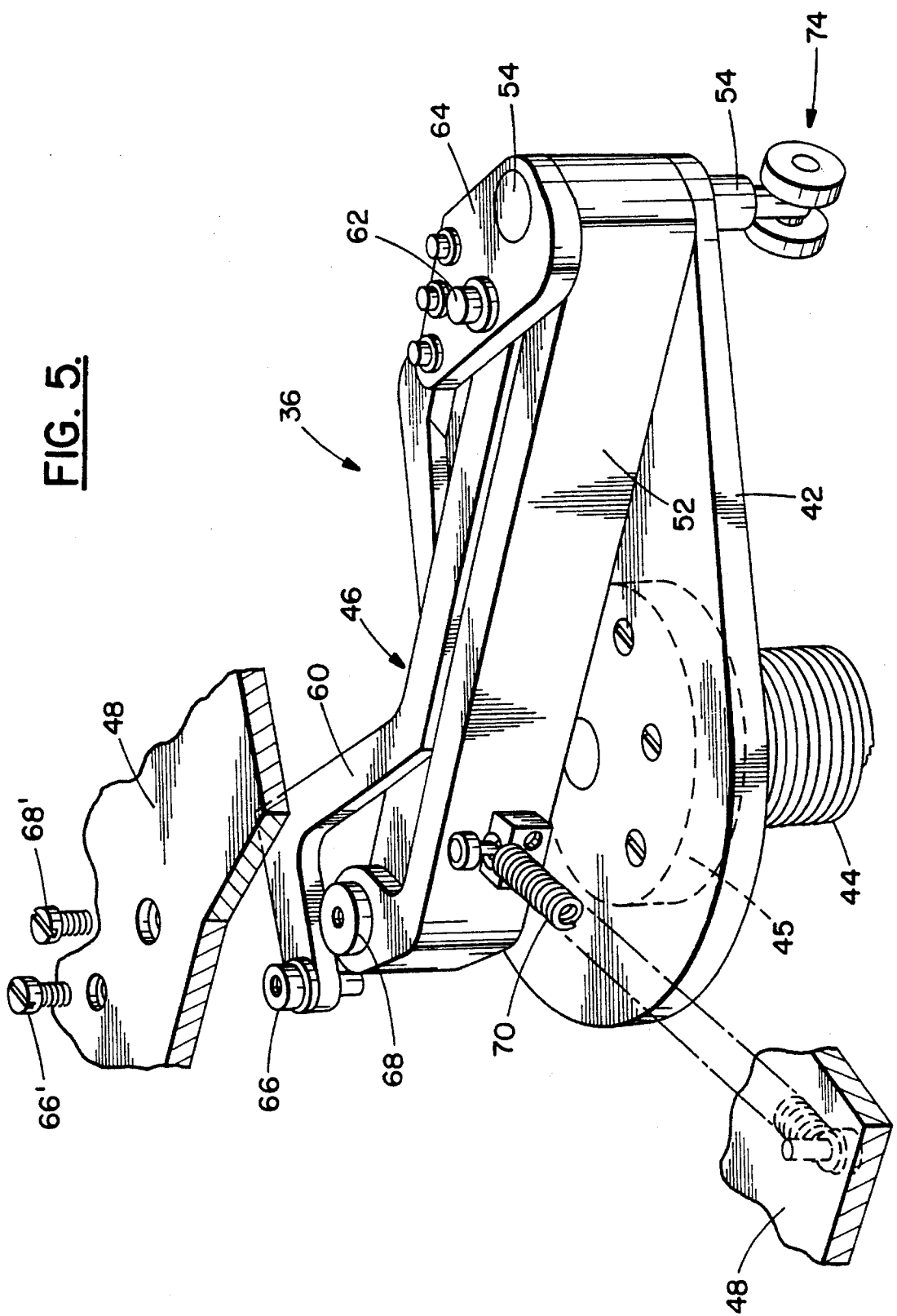
FIG. 5 is a perspective view, certain parts being cut away and shown in section for clarity, illustrating the transfer apparatus of the invention.
Figure 6:
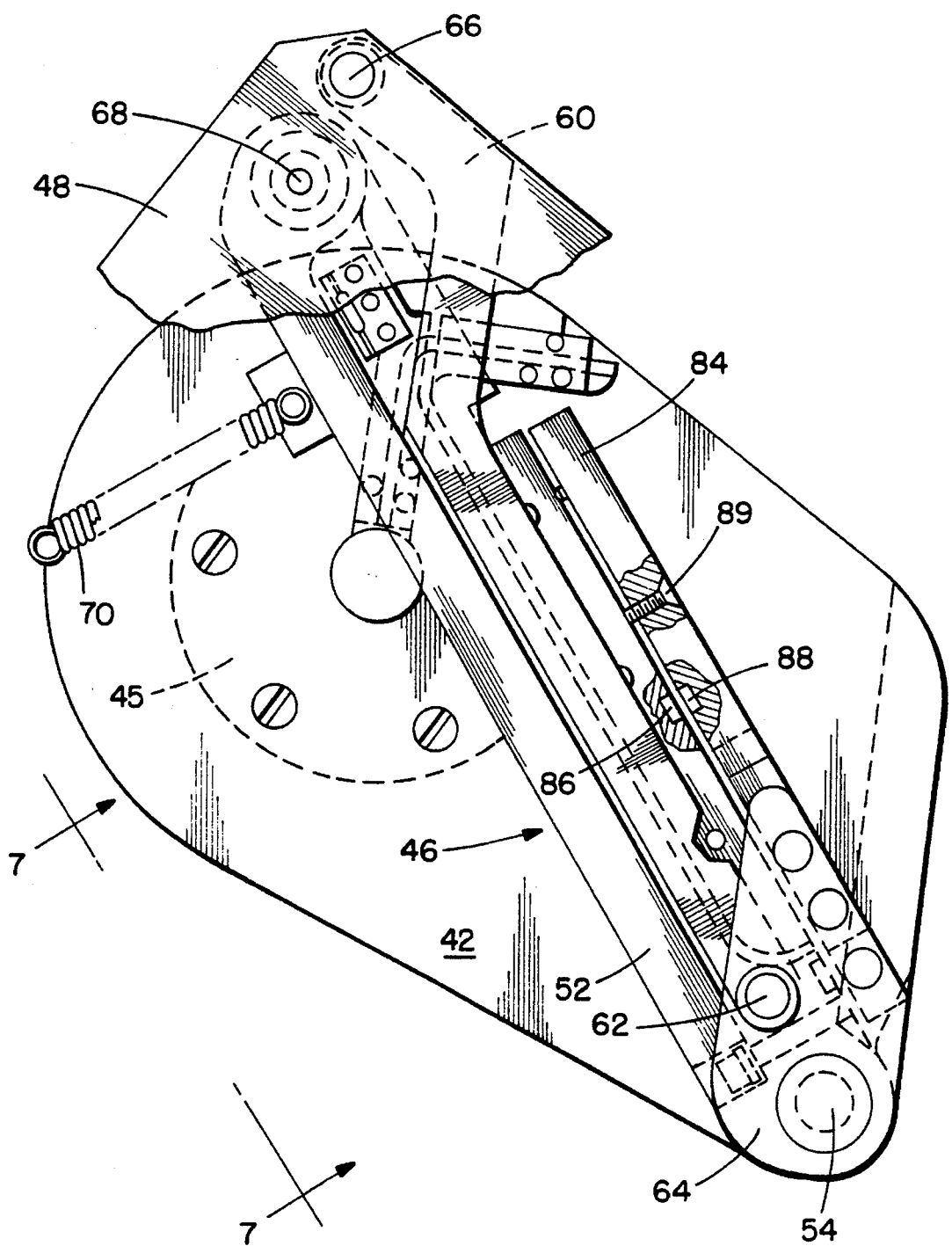
FIG. 6 is a top plan view of the transfer apparatus illustrated in FIG. 5.

In any event, it is customary to carry a large number of wafers 25 (FIG. 2) within a cassette 26 or within a controlled environment carrier such as a SMIF ("standard mechanical interface") box. In such instances, a plurality of the wafers is loaded into the cassette where they are supported in a spaced, stacked, relationship, then transported manually, or otherwise, and placed on a shelf 28 adjacent an associated system 20 to await entry for processing. Previously, the cassette would be manually, or robotically from outside, placed into a waiting chamber 30 within a load lock 32 when an entry door 34 (FIGS. 2, 3, 4) has been opened enabling access through a load port 35 (FIG. 4). By means of a transfer apparatus 36 to be described, the cassette 26 is lifted off the shelf 28 and moved into the chamber 30 of the load lock 32 from within the chamber. Subsequently, by means of apparatus forming no part of the present invention, the wafers 25 are moved one by one to a transport chamber 38 and, from there, to one or more of a plurality of processing stations 40.

According to the invention, turning now more particularly to FIGS. 4–9, the transfer apparatus 36 comprises a base plate 42 and an elevator drive mechanism 44 which is operable for selectively moving the base plate between a raised position (as depicted by dashed lines in FIG. 4) and a lowered position (as depicted by solid lines in FIG. 4). Such movement may be performed, as desired, either for a substantial distance, or incrementally. A drive arm mechanism 46 is mounted on the base plate 42 and, in turn, mounts a planar platform 48 for supporting a load, specifically, a cassette 26 or other form of wafer carrier. The construction about to be described operates to move the platform 48 in plane between a retracted position (FIGS. 3 and 8) whereat the platform assumes a first orientation and an extended position (FIGS. 4 and 9) whereat the platform assumes a second orientation angularly transposed from the first orientation. Even as the platform 48 is moved to the extended position, it remains substantially in the plane occupied when in the retracted position.

Figure 10:
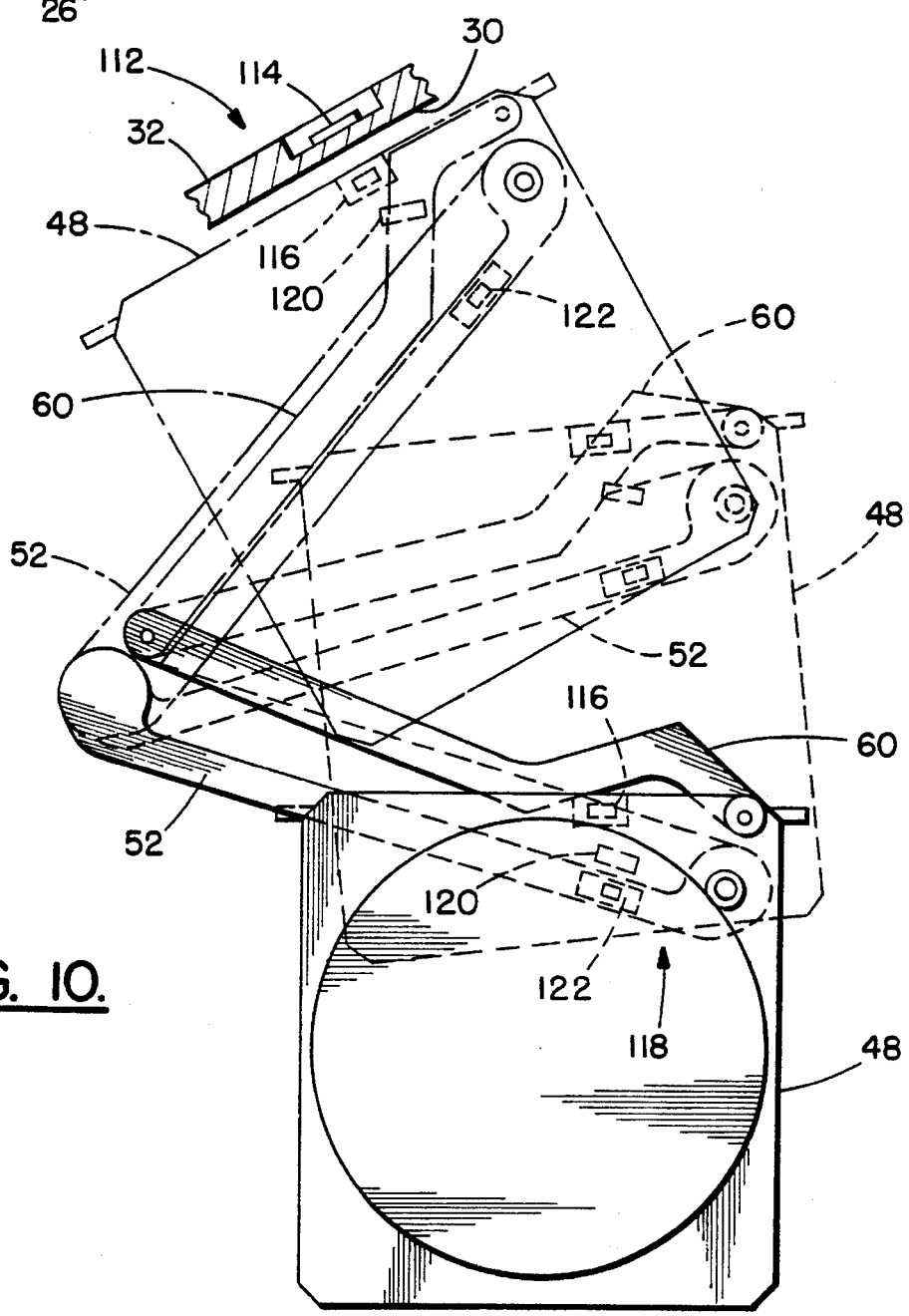
FIG. 10 is a top plan view illustrating the kinematics of certain components of the invention as they move from a retracted position to an intermediate position and finally to an extended position.
Figure 2:
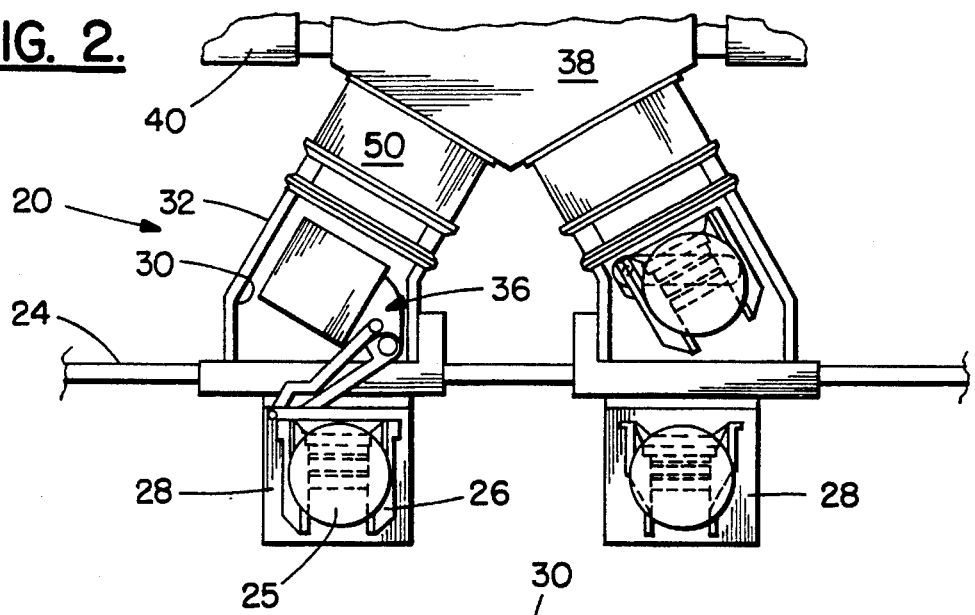
FIG. 2 is a top plan diagrammatic view illustrating, in greater detail, a single one of the processing systems of FIG. 1 and utilizing wafer transfer apparatus embodying the present invention.

For a more enlightened understanding of the terms "first orientation" and "second orientation", turn to FIG. 2 where it is seen that the cassette 26 has been properly placed on the shelf 28 such that its square sides are either parallel with the wall 24 or perpendicular thereto. However, when placed onto the platform 48 within the chamber 30, it is necessary to be skewed relative to the plane of the wall 24 to properly enable subsequent transfer of wafers 25 to the transport chamber 38 and, thereafter, to the processing stations 40. The transfer apparatus 36 assures that during transfer of the cassette 26 from the shelf 28 into the chamber 30, the platform will have properly moved, in plane, from an orientation generally aligned with the wall 4 to an orientation generally aligned with an interface valve 50 between the load lock 32 and the transport chamber 38. FIG. 10 is a top plan view depicting the kinematics involved as the platform 48 is moved from the retracted position through an intermediate position and finally to the extended position.

To this end, the drive arm mechanism 46 includes a drive arm 52 which is pivotally mounted on the base plate 42 in a manner which enables its movement between the retracted position (FIG. 8) and the extended position (FIG. 9) as previously described. More specifically, a vertically extending drive arm shaft 54 is rotatably mounted on the base plate by means of spaced bearings 56, 58, and the drive arm is fixed, as by keying, for example, to the drive arm shaft for movement of the platform 48 between the retracted position and the extended position;

A constraining link 60 extends between the base plate 42 and the platform 48. More specifically, the constraining link is pivotally mounted, as by a first link pin 62 to a base support 64 which is integral with the base plate 42 and extends in a plane parallel to but spaced from the base plate. A second link pin 66 distant from the first link pin 62 serves for pivotally connecting the constraining link and the platform. A drive arm pin 68 distant from the drive arm shaft 54 serves for pivotally connecting the drive arm and the platform. In this arrangement, the first link pin 62 is proximate to, but spaced from, the drive arm shaft 54 and the second link pin 66 is proximate to, but spaced from, the drive arm pin. Furthermore, it will be appreciated that the longitudinal axes of the drive arm shaft 54, the drive arm pin 68, the first link pin 62, and the second link pin 66 are all generally parallel. Furthermore, these components are all mutually positioned to assure that when the drive arm mechanism 46 moves from the retracted position to the extended position, the platform 48 simultaneously moves from its first orientation to its second orientation as explained above.

A resilient member in the form of a tension spring 70 extends between and is fixed to, respectively, the platform 48 and the drive arm 52 for, inter alia, biasing the platform to the retracted position.

The transfer apparatus 36 further includes a drive shaft 72 and a suitable motor 73 for rotating the drive shaft. A coupling mechanism 74 (see especially FIGS. 7 and 11–13) drivingly connects the drive arm shaft 54 to the drive shaft 72 throughout a range of positions to be achieved by the base plate 42 and the cassette 26 supported thereon between the raised and lowered positions (FIG. 4). The drive arm shaft 54 has a longitudinal axis which is vertically oriented and extends to a lower end proximate to which a diametrically extending axle 76 is fixed. The axle may be fittingly received in a diametral bore and have diametrically opposed ends projecting from the drive arm shaft 54. A pair of opposed rollers 78 are rotatably mounted on the axle at its opposed ends, respectively.

The drive shaft 72 is axially aligned with the drive arm shaft 54 and extends to an upper end at which a pair of axially extending diametrically opposed drive projections 80 extend beyond the upper end of the drive shaft and have first and second rolling surfaces 82 for engageable reception thereon, respectively, of the rollers 78. With this construction, throughout operation of the elevator drive mechanism 44, the rollers 78 remain engaged with their respective rolling surfaces for thereby rotating the drive arm shaft 54.

As seen in FIGS. 5–9, a stop plate 84 is integral with and is upstanding from the base plate 42. The tension spring 70 also biases the drive arm 52 into a proximate relationship with the stop plate. This occurs when the platform 48 and the drive arm mechanism 46 are in the retracted position. For temporarily holding or biasing the drive arm 52 into such a proximate relationship with the stop plate, a first magnet 86 is suitably mounted on the drive arm and a second magnet 88 having an opposite polarity from the magnet 86 is suitably mounted on the stop plate. For this purpose, the second magnet is juxtaposed with the first magnet when the drive arm 52 is proximately disposed with the stop plate 84. A set screw 89 threadedly engaged with an appropriate tapped hole in the stop plate 84 (FIG. 6) projects from a lateral surface of the stop plate and its distal end engages the drive arm 52 when the drive arm is proximately positioned relative to the stop plate. By manipulating the set screw 89, the spacing between the drive arm and the stop plate can be adjusted.

Figure 7:
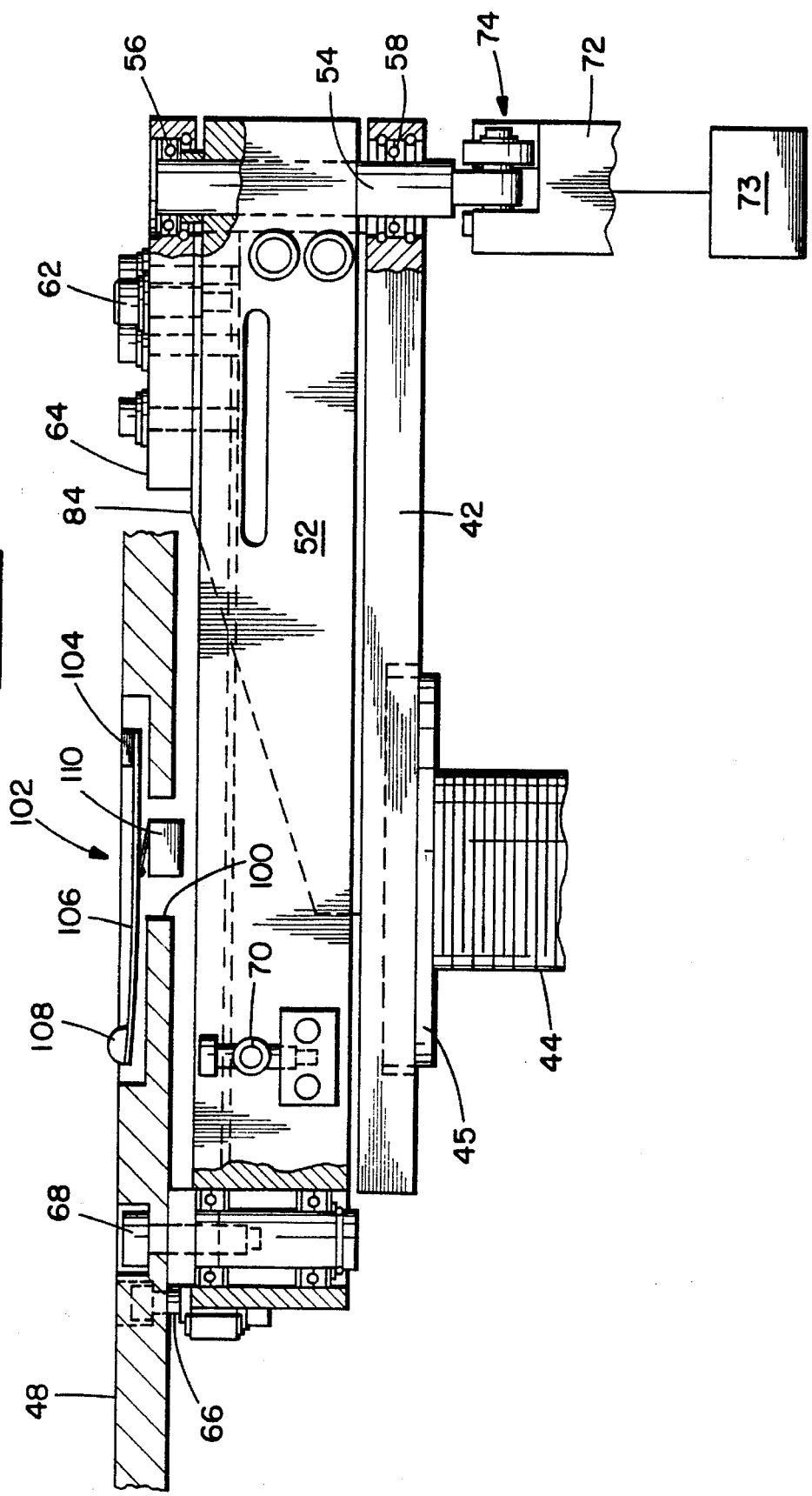
FIG. 7 is a side elevation view, certain parts being cut away and shown in section for clarity, of the transfer apparatus illustrated in FIGS. 5 and 6.
Figure 8:
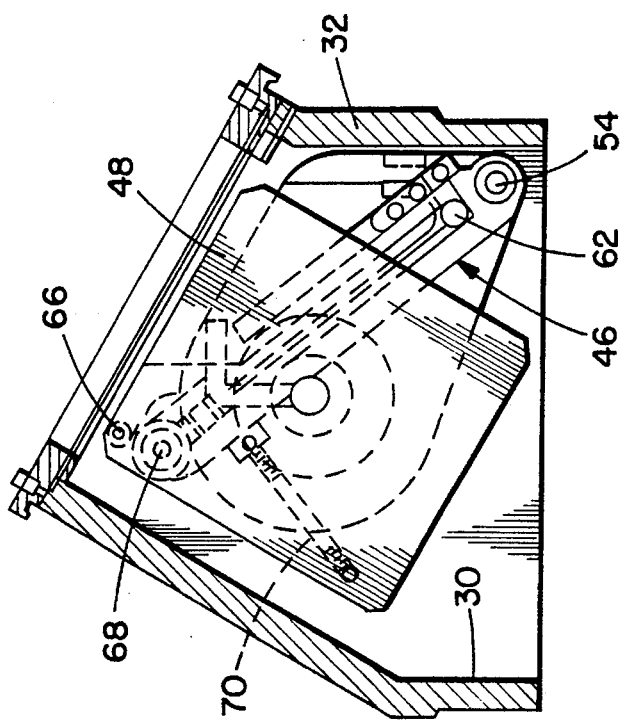
FIG. 8 is an enlarged top plan view, certain parts being cut away and shown in section for clarity, illustrating in still greater detail the construction shown in FIG. 2, with components being depicted in the retracted position.
Figure 9:
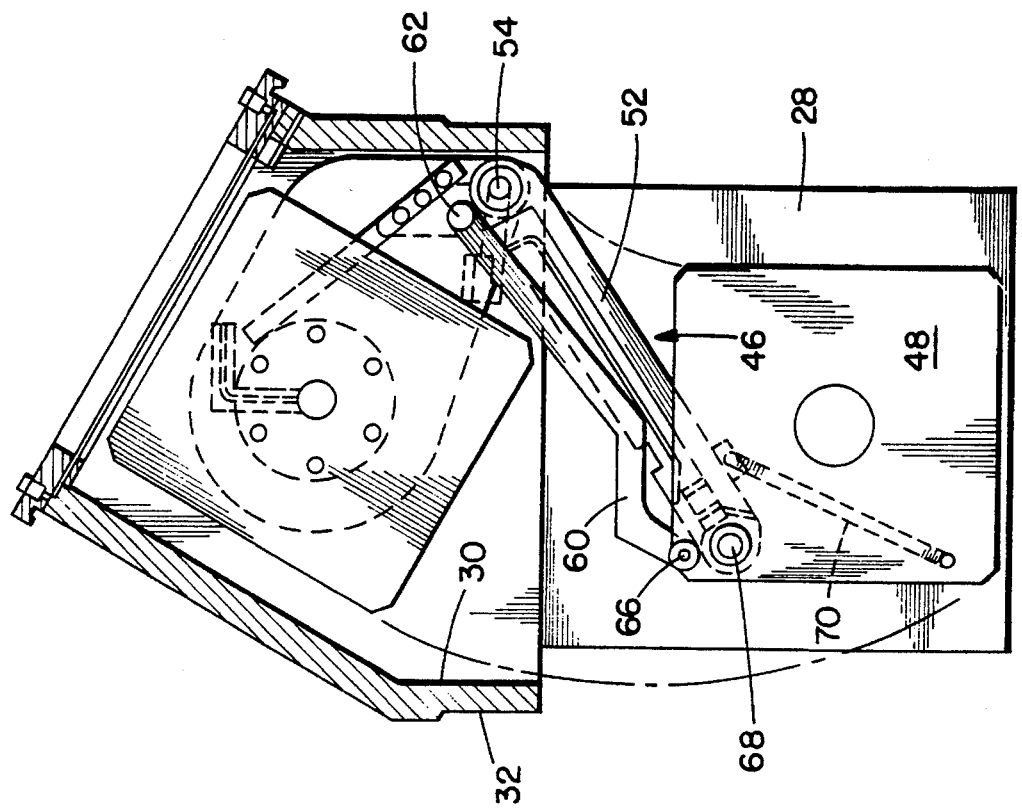
FIG. 9 is an enlarged top plan view, similar to FIG. 8, with components being depicted in the extended position.
Figure 11:
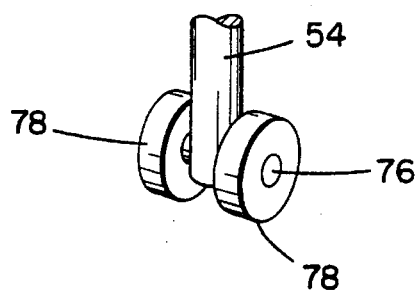
FIG. 11 is a detail perspective view illustrating a component of the invention.
Figure 12:
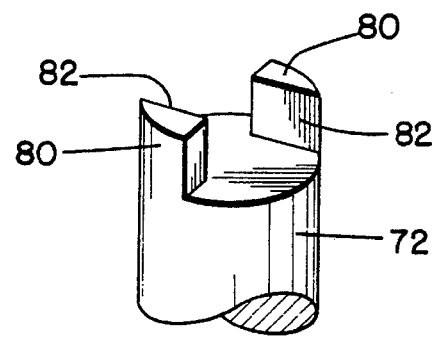
FIG. 12 is a detail perspective view illustrating another component of the invention.
Figure 13:
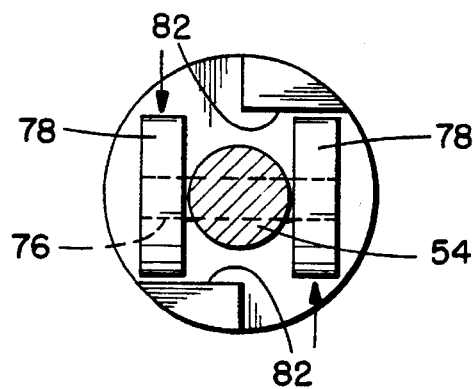
FIG. 13 is a top plan view, partly in section, illustrating the individual components of FIGS. 11 and 12 in interengaging relationship.

Operation of the transfer apparatus 36 may be initiated, for example, with an empty platform 48 positioned within the chamber 30 (see FIG. 8). Thereupon, the motor 73 (FIG. 7) is operated to rotate the drive shaft 72 and, with it, the drive arm shaft 54 which causes the platform 48 to advance to the extended position (see FIG. 9). The platform 48 is at a proper elevation to slide freely beneath a cassette 26 supported on the shelf 28 (FIG. 2). When the platform 48 is squarely positioned beneath the cassette, the elevator drive mechanism 44 is operated to raise the cassette off the shelf 28 and the motor 73 is again operated, but reversed from its earlier operation, to return the platform 48, now supporting the cassette, into the chamber 30 so that it again assumes the position indicated in FIG. 8.

Figure 14:
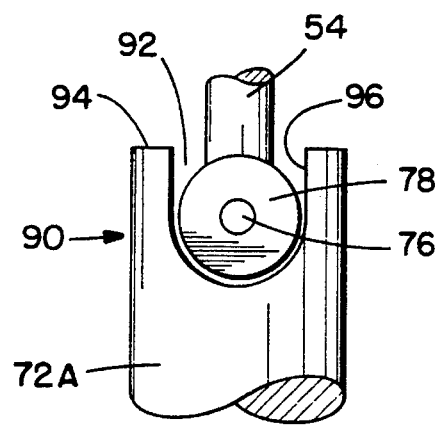
FIG. 14 is a detail side elevation view of another embodiment of the invention.
Figure 15:
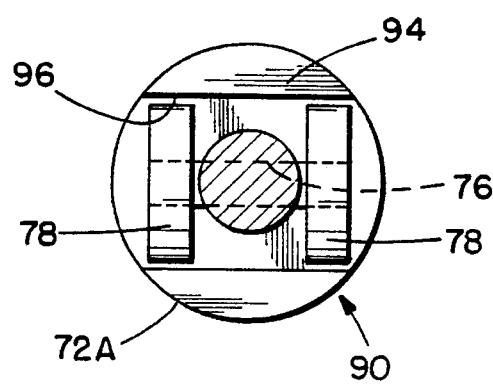
FIG. 15 is a top plan view of the embodiment illustrated in FIG. 14.

Another embodiment of the invention, a coupling mechanism 90, may have the construction illustrated in FIGS. 14 and 15. In this instance, a modified drive shaft 72A has a transverse slot 92 at its upper end between opposed bifurcated limbs 94 defining opposed rolling surfaces 96. The lower end of the drive arm shaft 54 has the same construction as previously described and illustrated in FIG. 10. As such, the rollers 78 are rollingly received within the slot 92, engaged with the rolling surfaces 96. As in the instance of the earlier described embodiment, rotation of the drive shaft 72A imparts rotation to drive arm shaft 54 even as the latter is being raised and lowered in unison with the base plate 42.

Figure 16:
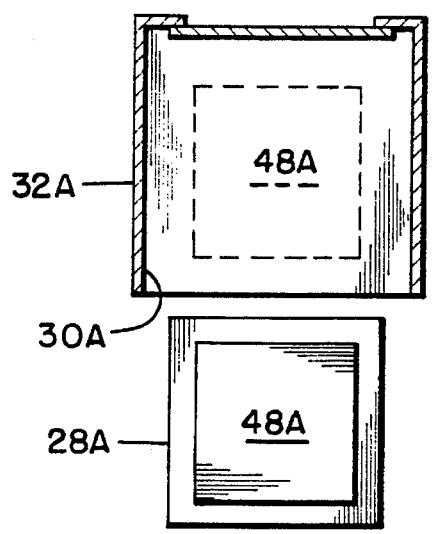
FIG. 16 is a detail top plan view of another embodiment of the invention.

Yet another embodiment of the invention is illustrated in FIG. 16. In this instance, a shelf 28A for supporting a wafer-containing cassette is positioned squarely in front of a load lock 32A such that a platform 48A for receiving the cassette thereon has the same angularly disposed orientation when in the retracted position as in the extended position all the while remaining substantially in the plane occupied when in the retracted position. This result is obtained by suitably adjusting the relative lengths of the drive arm 52 and of the constraining link 60.

The transfer apparatus 36 is provided with appropriate sensing devices for indicating the condition of the operating components. For example, it is desirable to know whether or not a cassette is placed on the platform 48. As seen in FIG. 7, the platform 48 has a recessed region 100 for receiving a cassette present sensor 102. The sensor 102 includes a base 104 for attaching a flexure 106 to the platform. A cassette engaging button 108 is integral with a terminal end of the flexure 106. The flexure 106 overlies a switch 110 which is also mounted on the platform 48. When a cassette is placed on the platform 48, it engages the button 108, depressing the flexure 106 and actuating the switch 110. When a cassette is removed from the platform, the button 108 is no longer engaged such that the flexure 106 swings out of engagement with the switch 110 which is no longer actuated.

The transfer apparatus 36 is also provided with appropriate sensing devices for indicating the position of the platform 48, whether it is in the retracted position or in the extended position. For example, viewing FIG. 10, a retract sensor 112 includes a magnet 114 suitably mounted on the wall of the load lock 32 and an associated magnetic reed switch 116 mounted on an underside of the platform 48. When the platform is in the retracted position (indicated by intermittently broken lines), the magnet 114 actuates the switch 116 to indicate that the platform is, in fact, in the retracted position. In a similar manner, an extend sensor 118 includes a magnet 120 suitably mounted on an underside of the platform 48 and an associated magnetic reed switch 122 mounted on the link 60. When the platform is in the extended position (indicated by solid lines), the magnet 120 actuates the switch 122 to indicate that the platform is, in fact, in the extended position.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. Apparatus for transferring a load comprising:

a base member;

a planar platform for supporting a load; and drive arm means mounted on said base member for moving said platform in plane between a retracted position whereat said platform assumes a first orientation and an extended position whereat said platform assumes a second orientation angularly transposed from the first orientation while remaining substantially in the plane occupied when in the retracted position; and resilient means biasing said platform to the retracted position;

said drive arm means including:
  a drive arm pivotally mounted on said base member and movable between the retracted position and the extended position;
  a drive arm shaft rotatably mounted on said base member, said drive arm being fixed to said drive arm shaft for movement of said platform between the retracted position and the extended position;
  a constraining link extending between said base member and said platform;
  a first link pin for pivotally connecting said constraining link and said base member;
  a second link pin distant from said first link pin for pivotally connecting said constraining link and said platform; and
  a drive arm pin distant from said drive arm shaft for pivotally connecting said drive arm and said platform;

said first link pin being proximate to, but spaced from, said drive arm shaft; and said second link pin being proximate to, but spaced from, said drive arm pin.

2. Apparatus for transferring a load as set forth in claim 1 wherein the first orientation assumed by said platform in the retracted position is the same as the second orientation assumed by said platform in the extended position.

3. Apparatus for transferring a load as set forth in claim 1 wherein the first orientation assumed by said platform in the retracted position is angularly transposed from the second orientation assumed by said platform in the extended position.

4. Apparatus for transferring a load as set forth in claim 1 wherein each of said drive arm shaft, said drive arm pin, said first link pin, and said second link pin has a longitudinal axis; and
wherein the longitudinal axes of said drive shaft, said drive arm pin, said first link pin, and said second link pin are all generally parallel.

5. Apparatus for transferring a load as set forth in claim 1 wherein said drive shaft, said drive arm pin, said first link pin, and said second link pin are all mutually positioned to assure that when said drive arm means moves from the retracted position to the extended position, said platform simultaneously moves from the first orientation to the second orientation.

6. Apparatus for transferring a load as set forth in claim 1 including:
a load lock defining a chamber therein and having a load port opening into the load lock chamber.

7. Apparatus for transferring a load as set forth in claim 1 wherein said resilient means includes a tension spring extending between and fixed to, respectively, said platform and said drive arm.

8. Apparatus for transferring a load comprising:
a base member;
a planar platform for supporting a load; and
drive arm means mounted on said base member for moving said platform in plane between a retracted position whereat said platform assumes a first orientation and an extended position whereat said platform assumes a second orientation angularly transposed from the first orientation while remaining substantially in the plane occupied when in the retracted position;

said drive arm means including:
  a drive arm pivotally mounted on said base member and movable between the retracted position and the extended position;
  a drive arm shaft rotatably mounted on said base member, said drive arm being fixed to said drive arm shaft for movement of said platform between the retracted position and the extended position;
  a constraining link extending between said base member and
  said platform;
  a first link pin for pivotally connecting said constraining link and said base member;
  a second link pin distant from said first link pin for pivotally connecting said constraining link and said platform; and
  a drive arm pin distant from said drive arm shaft for pivotally connecting said drive arm and said platform;

said first link pin being proximate to, but spaced from, said drive arm shaft; and said second link pin being proximate to, but spaced from, said drive arm pin;

elevator drive means operable for selectively moving said base member between a raised position and a lowered position;

a drive shaft;

motor means for rotating said drive shaft; and coupling means for drivingly connecting said drive arm shaft to said drive shaft throughout a range of positions between the raised position and the lowered position;

wherein said drive arm shaft has a longitudinal axis which is vertically oriented and extends to a lower end;

wherein said drive shaft is axially aligned with said drive arm shaft and extends to an upper end;

wherein said coupling means includes:
  a diametrically extending axle fixed to said drive arm shaft proximate said lower end and having diametrically opposed ends projecting from said drive arm shaft;
  first and second opposed rollers rotatably mounted on said axle at said opposed ends, respectively; and
  first and second axially extending diametrically opposed projections extending beyond said upper end of said drive shaft and having first and second rolling surfaces for engageable reception thereon of said first and second rollers;
  whereby throughout operation of said elevator drive means, said first and second rollers remain engaged with said first and second rolling surfaces, respectively, for driving said drive arm shaft.

9. Apparatus for transferring a load as set forth in claim 8 including:
resilient means biasing said platform to the retracted position.

10. Apparatus for transferring a load as set forth in claim 9 wherein said resilient means includes a tension spring extending between and fixed to, respectively, said platform and said drive arm.

11. Apparatus for transferring a load as set forth in claim 9 including:
   a stop plate integral with and upstanding from said base plate, said resilient means biasing said drive arm into a proximate relationship with said stop plate.

12. Apparatus for transferring a load as set forth in claim 10 including:
   a first magnet mounted on said drive arm;
   a second magnet having an opposite polarity from said first magnet mounted on said stop plate, said second magnet being juxtaposed with said first magnet when said drive arm is proximately disposed with said stop plate to thereby draw said drive arm toward said stop plate.

13. In combination with a load lock defining a chamber therein having a substantially particle free environment and including a load port opening into the load lock chamber, apparatus for transferring a load of semiconductor wafers comprising:
   a base member mounted inside the load lock chamber;
   a planar platform for supporting a portable carrier having rack members for receiving and transporting a plurality of the wafers in spaced generally stacked relationship; and
   drive arm means mounted on said base member for moving said platform in plane between a retracted position externally of the load lock chamber whereat said platform assumes a first orientation and an extended position within the load lock chamber whereat said platform assumes a second orientation angularly transposed from the first orientation while remaining substantially in the plane occupied when in the retracted position; and
   resilient means biasing said platform to the retracted position;
   said drive arm means including:
      a drive arm pivotally mounted on said base member and movable between the retracted position and the extended position, said planar platform being mounted on said drive arm;
      a drive arm shaft rotatably mounted on said base member, said drive arm being fixed to said drive arm shaft for movement of said platform between the retracted position and the extended position;
      a constraining link extending between said base member and said platform;
      a first link pin for pivotally connecting said constraining link and said base member;
      a second link pin for pivotally connecting said constraining link and said platform; and
      a drive arm pin for pivotally connecting said drive arm and said platform;
   said first link pin being proximate to, but spaced from, said drive arm shaft;
   said second link pin being proximate to, but spaced from, said drive arm pin.

14. Apparatus for transferring a load as set forth in claim 13
   wherein the first orientation assumed by said platform in the retracted position is the same as the second orientation assumed by said platform in the extended position.

15. Apparatus for transferring a load as set forth in claim 13
   wherein the first orientation assumed by said platform in the retracted position is angularly transposed from the second orientation assumed by said platform in the extended position.

16. The combination as set forth in claim 13
   wherein each of said drive arm shaft, said drive arm pin, said first link pin, and said second link pin has a longitudinal axis; and
   wherein the longitudinal axes of said drive shaft, said drive arm pin, said first link pin, and said second link pin are all generally parallel.

17. The combination for transferring a load as set forth in claim 13
   wherein said drive shaft, said drive arm pin, said first link pin, and said second link pin are all mutually positioned to assure that when said drive arm means moves from the retracted position to the extended position, said platform simultaneously moves from the first orientation to the second orientation.

18. The combination for transferring a load as set forth in claim 13
   wherein said resilient means includes a tension spring extending between and fixed to, respectively, said platform and said drive arm.

19. Apparatus for transferring a load as set forth in claim 13 including:
   a stop plate integral with and upstanding from said base plate, said resilient means biasing said drive arm into a proximate relationship with said stop plate.

20. Apparatus for transferring a load as set forth in claim 19 including:
   a first magnet mounted on said drive arm;
   a second magnet having an opposite polarity from said first magnet mounted on said stop plate, said second magnet being juxtaposed with said first magnet when said drive arm is proximately disposed with said stop plate to thereby draw said drive arm toward stop plate.

21. In combination with a load lock defining a chamber therein having a substantially particle free environment and including a load port opening into the load lock chamber, apparatus for transferring a load of semiconductor wafers comprising:
   a base member mounted inside the load lock chamber;
   a planar platform for supporting a portable carrier having rack members for receiving and transporting a plurality of the wafers in spaced generally stacked relationship; and
   drive arm means mounted on said base member for moving said platform in plane between a retracted position externally of the load lock chamber whereat said platform assumes a first orientation and an extended position within the load lock chamber whereat said platform assumes a second orientation angularly transposed from the first orientation while remaining substantially in the plane occupied when in the retracted position;
   elevator drive means operable for selectively moving said base member between a raised position and a lowered position;
   a drive shaft;
   motor means for rotating said drive shaft; and
   coupling means for drivingly connecting said drive arm shaft to said drive shaft throughout a range of positions between the raised position and the lowered position;

said drive arm means including:
  a drive arm pivotally mounted on said base member and movable between the retracted position and the extended position;
  a drive arm shaft rotatably mounted on said base member, said drive arm being fixed to said drive arm shaft for movement of said platform between the retracted position and the extended position;
  a constraining link extending between said base member and said platform;
  a first link pin for pivotally connecting said constraining link and said base member;
  a second link pin for pivotally connecting said constraining link and said platform; and
  a drive arm pin for pivotally connecting said drive arm and said platform;
said first link pin being proximate to, but spaced from, said drive arm shaft; and
said second link pin being proximate to, but spaced from, said drive arm pin;
wherein said drive arm shaft has a longitudinal axis which is vertically oriented and extends to a lower end;
wherein said drive shaft is axially aligned with said drive arm shaft and extends to an upper end; and
wherein said coupling means includes:
  a diametrically extending axle fixed to said drive arm shaft proximate said lower end and having diametrically opposed ends projecting from said drive arm shaft;
  first and second opposed rollers rotatably mounted on said axle at said opposed ends, respectively; and
  first and second axially extending diametrically opposed projections extending beyond said upper end of said drive shaft and having first and second rolling surfaces for engageable reception thereon of said first and second rollers;
whereby throughout operation of said elevator drive means, said first and second rollers remain engaged with said first and second rolling surfaces, respectively, for driving said drive arm shaft.

* * * * *